United States Patent
Chou et al.

(10) Patent No.: US 8,572,520 B2
(45) Date of Patent: Oct. 29, 2013

(54) OPTICAL PROXIMITY CORRECTION FOR MASK REPAIR

(75) Inventors: Chih-Shiang Chou, Pingzhen (TW); Ya-Ting Chang, Caotun Township, Nantou County (TW); Fu-Sheng Chu, Zhubei (TW); Yu-Po Tang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/409,515

(22) Filed: Mar. 1, 2012

(65) Prior Publication Data

US 2013/0232454 A1 Sep. 5, 2013

(51) Int. Cl.
*G06F 17/50* (2006.01)
*G06G 7/62* (2006.01)

(52) U.S. Cl.
USPC .......... 716/53; 716/50; 716/51; 716/52; 703/13

(58) Field of Classification Search
None
See application file for complete search history.

(56) References Cited

U.S. PATENT DOCUMENTS

| | | | | |
|---|---|---|---|---|
| 6,578,188 | B1* | 6/2003 | Pang et al. | 716/52 |
| 7,488,933 | B2* | 2/2009 | Ye et al. | 250/252.1 |
| 7,535,640 | B2 | 5/2009 | Totzeck et al. | |
| 2007/0032896 | A1* | 2/2007 | Ye et al. | 700/108 |
| 2011/0049601 | A1* | 3/2011 | Kai et al. | 257/315 |

OTHER PUBLICATIONS

Chris Mack, The Formation of an Aerial Image, Microlithography World, Jan.-Dec. 1993, 7 pages.*

* cited by examiner

*Primary Examiner* — A. M. Thompson
(74) *Attorney, Agent, or Firm* — Haynes and Boone, LLP

(57) ABSTRACT

Integrated circuit (IC) methods for optical proximity correction (OPC) modeling and mask repair are described. The methods include use of an optical model that generates a simulated aerial image from an actual aerial image obtained in an optical microscope system. In the OPC modeling methods, OPC according to stage modeling is simulated, and OPC features may be added to a design layout according to the simulating OPC. In the mask repair methods, inverse image rendering is performed on the actual aerial image and diffraction image by applying an optical model that divides an incoherent exposure source into a plurality of coherent sources.

18 Claims, 4 Drawing Sheets $$I_{\text{Microscope}}(\vec{x}) = \int \left| \vec{E}_{\text{Microscope}}^{\vec{f}_s}(\vec{f}_s) \cdot \mathfrak{I}^{-1}\left[\vec{h}_{\text{Polarization}} h_{\text{Microscope}}(\vec{f}+\vec{f}_s) \mathfrak{I}[M(\vec{x})]\right] \right|^2 2\pi f_s df_s$$

$$\approx \int J_{\text{Microscope}}(\vec{f}_s) \left| \mathfrak{I}^{-1}\left[h_{\text{Microscope}}(\vec{f}+\vec{f}_s) \tilde{M}(\vec{f})\right] \right|^2 2\pi f_s df_s$$

$$I_{\text{Microscope}}(\vec{x}) = \int J_{\text{Microscope}}(\vec{f}_s) \left| \mathfrak{I}^{-1}\left[h_{\text{Microscope}}(\vec{f}+\vec{f}_s) \tilde{M}(\vec{f})\right] \right|^2 2\pi f_s df_s$$

$$I_{\text{Microscope}}^{\vec{f}_s}(\vec{x}) \approx J_{\text{Microscope}}(\vec{f}_s) \Delta_{f_s} \left| \mathfrak{I}^{-1}\left[h_{\text{Microscope}}(\vec{f}+\vec{f}_s) \tilde{M}(\vec{f})\right] \right|^2$$

$$\tilde{E}_{\text{Microscope}}^{\vec{f}_s}(\vec{f}+\vec{f}_s) = \mathfrak{I}\left[E_{\text{Microscope}}^{\vec{f}_s}(\vec{x})\right] = \mathfrak{I}\left[\left|\mathfrak{I}^{-1}\left[h_{\text{Microscope}}(\vec{f}+\vec{f}_s) \tilde{M}(\vec{f})\right]\right|\right]$$

$$I_{\text{Wafer}}(\vec{r}) = \int \left| \vec{E}_{\text{Scanner}}^{f_s}(\vec{f_s}) \cdot \mathfrak{I}^{-1}\left[ \vec{h}_{\text{film}}(\vec{f}+\vec{f_s}) h_{0.25X}(\vec{f}+\vec{f_s}) \tilde{M}(\vec{f}) \right] \right|^2 2\pi f_s \, df_s$$

301

302

$$I_{\text{Wafer}}(\vec{r}) = \int \left| \vec{E}_{\text{Scanner}}^{f_s}(\vec{f_s}) \cdot \mathfrak{I}^{-1}\left[ \vec{h}_{\text{film}}(\vec{f}+\vec{f_s}) h_{0.25X}(\vec{f}+\vec{f_s}) h_{\text{Microscope}}^{-1}(\vec{f}+\vec{f_s}) \vec{E}_{\text{Microscope}}^{f_s}(\vec{f}+\vec{f_s}) \right] \right|^2 2\pi f_s \, df_s$$

OPTICAL PROXIMITY CORRECTION FOR MASK REPAIR

BACKGROUND

The minimum feature sizes of integrated circuits (ICs) have been shrinking for years. Commensurate with this size reduction, various process limitations have made IC fabrication more difficult. One area of fabrication technology in which such limitations have appeared is photolithography.

In semiconductor technologies, a plurality of photomasks or masks are formed with predesigned integrated circuit (IC) patterns. The plurality of masks are used to transfer those predesigned IC patterns to multiple semiconductor wafers in lithography processes. The predesigned IC patterns formed on the masks are master patterns. Any defect on a photomask will be transferred to multiple semiconductor wafers and cause yield issues. Therefore, the fabrication of a mask utilizes a high precision process. Further inspection and follow-up repair are also implemented to ensure that each mask is fabricated with high quality. However, existing practices on inspection and repairing of a mask are time-consuming and costly.

Known methods use an optical mask microscope to emulate the wafer image to inspect defects on the mask and predict the wafer image. Emulated images obtained by an optical microscope are not very similar to the image obtained by a scanner or stepper, and are different from the actual photoresist image due to refraction and reflection in the film stacks of the wafer. In addition, current empirical models lump optical and chemical effects. Thus, current methods do not accurately predict the optical behavior in the photoresist. Accordingly, what is needed is a method and system that addresses the above stated issues.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIG. 2 shows the calculations involved in an optical model used in the IC methods according to aspects of the present disclosure.

FIG. 3 shows the calculations involved in an optical model used in the IC methods according to aspects of the present disclosure.

DETAILED DESCRIPTION

Figure 1:
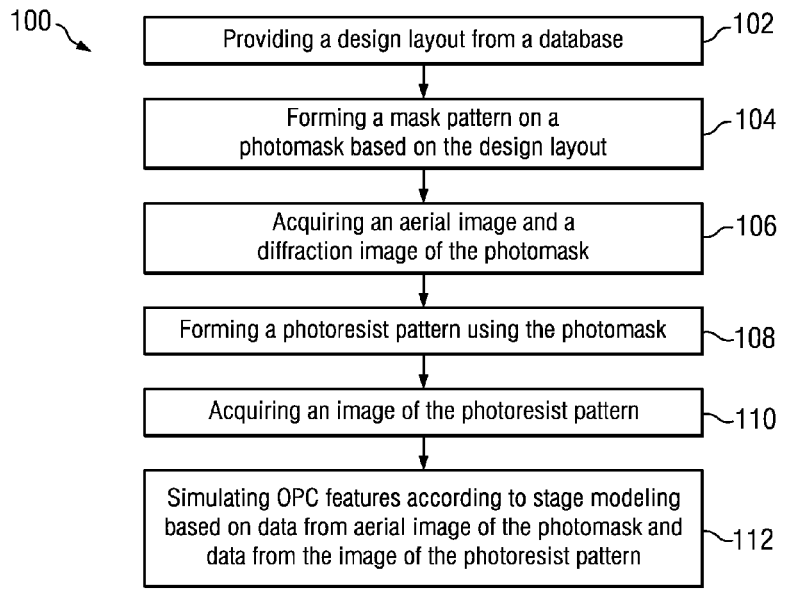
FIG. 1 is a flowchart illustrating an IC method according to aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, shown is a flowchart of an IC method 100, which is directed to optical proximity correction (OPC) modeling. The IC method 100 begins at block 102 by providing a design layout of an IC device from a database. The design layout may be a post-OPC design pattern. However, in other embodiments, the design pattern may be any virtual or physical design pattern. The design layout is typically stored in a design layout database. The design layout database stores a plurality of design layouts, such as design layout 1 (L-1), design layout 2 (L-2), design layout 3 (L-3), . . . design layout n (L-n), and so forth. Each design layout provides a design (or pattern) for a layer of an IC device. For example, a design layout provides a pattern for an active layer, a polysilicon layer, a contact/via layer, and/or a metal layer of an IC device. The design layouts are in any suitable file format, such as GDSII and/or write file format (e.g., MEBES). The design layouts are patterned onto a blank mask.

A mask pattern on a photomask that is based on the design layout provided at block 102 is created at block 104 using a mask process. The mask process is any mask process known in the art. The mask making process can be performed by a mask making system, which performs various patterning and etching processes to form the design layout pattern on the blank mask. The photomask or "reticle" includes a pattern corresponding to features at one layer in an IC design.

Acquisition of the aerial image and diffraction image may be obtained by a optical microscope with the same wavelength and the other optical setting. An Aerial Image Measurement System (AIMS) is one of the tools that is used to achieve this function. In the present embodiment, the diffraction image is an image of the photomask in a frequency space while the aerial image is an image of the photomask in a real space. The data from the aerial image and the data from the diffraction image are used for building a simulation model, for example. Continuing to block 106, an actual aerial image of the photomask is obtained, using, for example, an AIMS. The AIMS emulates a stepper or a scanner and creates a highly magnified image of the latent image produced by the mask. Specifically, the operational parameters of illumination and light collection in the AIMS, such as wavelength and NA, can be adjusted by the user to simulate the tool which will be used to expose wafers using the mask. The illumination is provided in a manner which simulates exposure in a stepper or a scanner, so that a latent image of the reticle is created. However, rather than placing a wafer at the location of the latent image, a sensor is placed so as to produce an aerial image of the latent image produced by the mask. Also, rather than providing reduction of the image like a stepper, the AIMS magnifies the latent image to enable easier image acquisition.

The AIMS is basically an engineering tool, which is intended for development and testing of various mask designs. It is also helpful for checking how OPC and phase shift features would print on the wafer. Additionally, the system can be used to study various defects discovered by mask inspection systems, and test whether those defects would actually print on the wafer.

Method 100 continues to block 108 where the photomask is used to form an actual photoresist pattern on a wafer. The patterned photomask is used much like a photographic negative to transfer circuit patterns (i.e., the design of a layer of an IC device) onto a semiconductor wafer. The patterns can translate into tiny transistors, electrical circuits, and/or other devices/circuits that make up a final IC device. The pattern can be transferred over and over onto multiple wafers through various lithography processes. Several masks (for example, a set of 15 to 30 masks) may be used to construct a complete IC device.

The actual photoresist pattern is formed by a lithography process. In one embodiment, the lithography process includes photoresist coating (e.g., spin-on coating), soft baking, mask aligning, exposure, post-exposure baking, developing the photoresist, rinsing, drying (e.g., hard baking), other suitable processes, and/or combinations thereof.

Method 100 proceeds to block 110 where an image of the actual photoresist pattern is acquired. Extracting the outline of the actual photoresist pattern may include, for example, imaging the actual photoresist pattern with a scanning electron microscope (SEM).

Continuing to block 112, OPC features can be simulated to correct any defects that are detected according to stage modeling based on the aerial image obtained from the optical microscope and data from the SEM image. The stage modeling is based on two mathematical models shown in FIGS. 2 and 3.

The two mathematical or optical models are used to calculate a simulated aerial image, which provides the simulated photoresist pattern on the wafer. The mathematical models are shown more fully in FIGS. 2 and 3. The first mathematical model 200 uses the aerial image and the diffraction image obtained from the optical microscope to simulate the image of the mask pattern. In other words, the model goes backwards to determine what the mask pattern would be based on the aerial image and the diffraction image. With a point illumination source the simulated mask pattern is calculated from the equation:

$$I_{Microscope}^{\bar{f}_s}(\bar{x}) = J_{Microscope}(\bar{f}_s) |\mathfrak{J}^{-1}[h_{Microscope}(\bar{f}+\bar{f}_s)\tilde{M}(\bar{f})]|^2$$

As shown in FIG. 2, the simulated mask pattern image is a function of light field of illumination of the microscope condenser 201, the transfer function of the microscope pupil 203, the light field through the mask 205, and polarization decomposition 208. The $\tilde{h}_{polar} \approx \tilde{I}$ for NA ~0. Arrow 202 indicates the inverse Fourier transform function, arrow 204 indicates the Fourier transform function, and the arrow 206 indicates "s," the spatial frequency of illumination, blank index means that of mask. Arrow 209 points to the intensity of the microscope condenser and arrow 207 indicates the function in frequency domain. Arrow 210 indicates the image in the microscope with point source illumination, while arrow 211 indicates the area of the point source. Arrow 212 points to the light field at pupil plane with oblique illumination incidence. This mathematical model assumes that an incoherent light source can be divided into a plurality of coherent light sources. The resulting images from each coherent light source can be summed together to form the complete simulated mask pattern image in different film stacks without measuring the wafer data. Instead, the whole incoherent image is dealt with. Thus, the mask pattern can be predicted without making an actual image on the wafer.

Moving to FIG. 3, a second mathematical model 300 is used to calculate the simulated aerial image or simulated photoresist pattern on the wafer. The real mask image can be seen optically without indirect SEM measurement. As shown, the simulated aerial image is a function of the light field of the scanner illumination 301, the transfer function of the scanner pupil 302, and the reflection and transmission computation with polarization decomposition 303. The simulated aerial image is calculated from the equation:

$$I_{Wafer}(\bar{x}) = \int |E_{Scanner}^{\bar{f}_s}(\bar{f}_s) \cdot \mathfrak{J}^{-1}[\tilde{h}_{film}(\bar{f}+\bar{f}_s)h_{0.25}(\bar{f}+\bar{f}_s)h_{Microscope}^{-1}(\bar{f}+\bar{f}_s)\tilde{E}_{Microscope}^{\bar{f}_s}(\bar{f}+\bar{f}_s)]|^2 2\pi f_s df_s$$

By combining these two models, a latent image in the photoresist can be reconstructed by acquiring the light filed at pupil plane from an actual mask. A modeling method in OPC, the hybrid Hopkins Abbe (HHA) method is used to describe light field after mask with oblique illuminations. In the present methods, a similar approach is used to acquire the amplitude and phase information for electromagnetic wave reconstruction by separated monopole illumination design in an AIMS tool. Following the HHA method that requires dividing the source pupil into several subregions or subsections and customizing the electromagnetic correction for one instance of incident angle per region, separate aerial image simulations for each of the source pupil subregions can be combined to form the composite simulated aerial image through their superposition.

Optical models can be built with electromagnetic wave reconstruction at mask near field and separated from lumped effects. A robust modeling for photoresist reactions becomes attainable. With an accurate simulated aerial image, it is possible to generate a separate model to calibrate the photoresist behavior.

The simulated aerial image may be compared with the SEM image to determine what OPC features should be added. These OPC features may be simulated into the mask. Specifically, this information may be used to generate OPC mask designs that compensate for mask patterning errors and give better wafer performance. OPC involves adding dark regions to and/or subtracting dark regions from a photomask design at locations chosen to overcome the distorting effects of diffraction and scattering. Typically, OPC is performed on a digital representation of a desired IC pattern. First, the digital pattern is evaluated with software to identify regions where optical distortion will result, and a digital representation of a photomask design is modified to create an optically corrected or OPC mask. The modification is performed by a computer having appropriate software for performing OPC. A mask simulator is then used to emulate the wafer printing characteristics of the OPC mask during optical lithography, resulting in an OPC aerial image.

In another embodiment, the method 100 may include a separate block to build one or more stage models based on data from the aerial image of the photomask and data from the image of the photoresist pattern. In furtherance of the embodiment, the simulation at block 112 is implemented after the stage models are formed.

In one embodiment, OPC features are added to a design layout based on the simulated OPC features. Thus, method 100 allows the build up of a more accurate database with design layouts that include OPC features. More OPC models are stored and more accurate simulations of the photomask can be made, thus improving OPC optical modeling and making it more robust. In another embodiment, the block 112 for simulation and a block for adding OPC features are collectively implemented in one procedure. In the present embodiment, the procedure may include adding a set of OPC features to the design layout. A simulation is performed to check the effect of the OPC features to the final photoresist pattern. If the difference between the simulated photoresist pattern and the expected photoresist pattern is out of a tolerable range, the OPC features are further tuned until the difference is in the tolerable range. In the procedure, the simulation may be implemented more than one time until the OPC features are acceptable. The tuned OPC features are added to the design layout. The design layout is associated with an integrated circuit product and may be different from one or more those design layouts used to build stage model(s).

The method 100 may further include other steps. In one embodiment, the method 100 further includes a step to fabricate one or more photomasks according to the design layout with added OPC features. In another embodiment, the method 100 further includes a step to fabricate a plurality of semiconductor wafers including a lithography process using the photomask(s).

Figure 4:
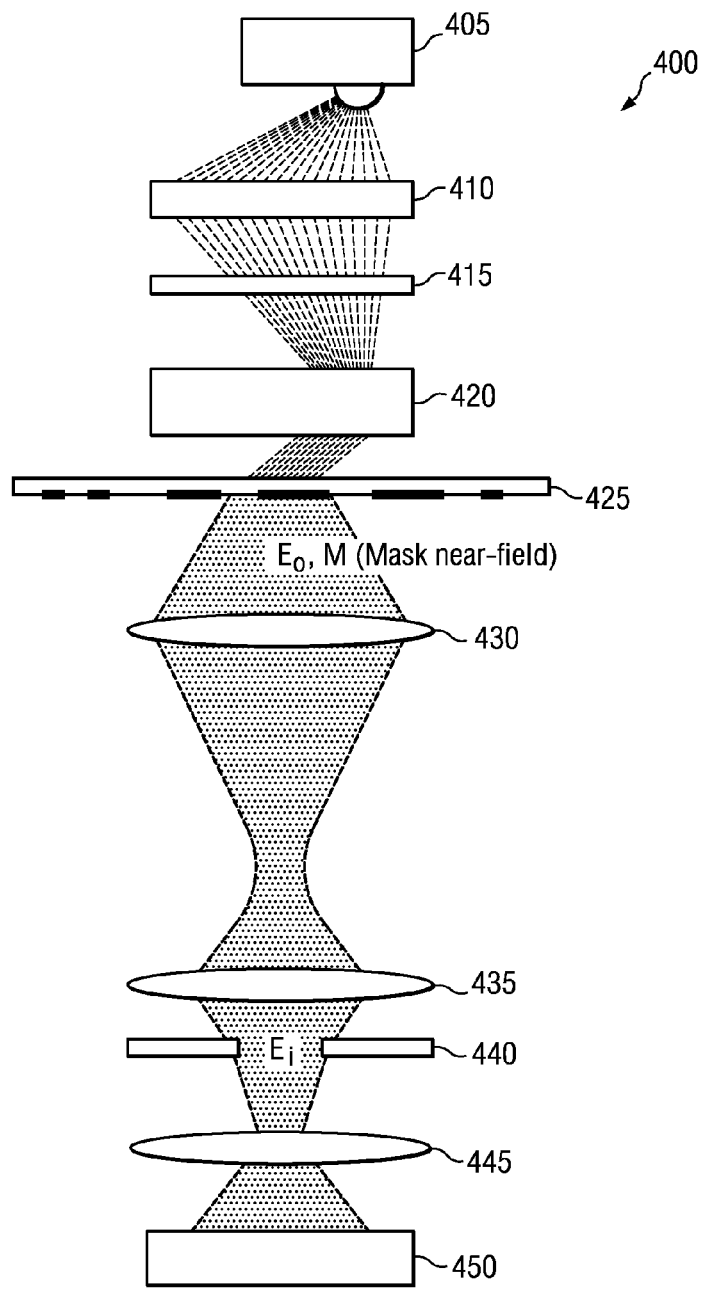
FIG. 4 illustrates an optical system suitable for use in IC methods according to the present disclosure.

Moving to FIG. 4, an optical system 400 that is suitable for used in the above-described stage modeling is shown. Optical system 400 is configured to detect defects in a mask design pattern, and to acquire images of a field in the actual photomask design pattern. The images illustrate how the field will be printed on a wafer.

Optical system 400 includes a light source 405. Light source 405 may include any suitable light source known in the art. In addition, light source 405 may be selected to simulate the light that a photomask would be illuminated with during a lithography process. For example, light source 405 may be configured to generate light having substantially similar characteristics (e.g., wavelength, polarization, intensity, etc.) of an exposure tool. As described previously, the mathematical models used assume that the incoherent light source can be divided into small coherent point sources. Light generated by light source 405 passes through tube lens 410, polarizer 415, and condenser lens 420. Light exiting condenser lens 420 illuminates mask or photomask 425. Tube lens 410, polarizer 415, and condenser lens 420 may be selected such that the light that illuminates photomask 425 has substantially similar characteristics as light that would illuminate photomask 425 in a stepper or scanner exposure tool.

Optical system 400 also includes objective lens 430 that is configured to collect light transmitted through photomask 425. Light passes through post magnifying optics 435, NA turntable 440, Bertrand optics 445, and finally to CCD-camera 450. CCD-camera 290 is configured to detect the light exiting Bertrand optics 280 to form images of the light transmitted by photomask 250.

The difference between the simulated aerial image obtained from optical system 400 and the SEM image isolates photoresist reaction effects. The optical behavior of the photoresist can be separated from lumped effects, such as photoresist reactions. Once the optical behavior is separated from lumped effects, the time spent calibrating lithography parameters can be largely reduced while only changing photoresist reaction effects but keeping optical settings.

Figure 5:
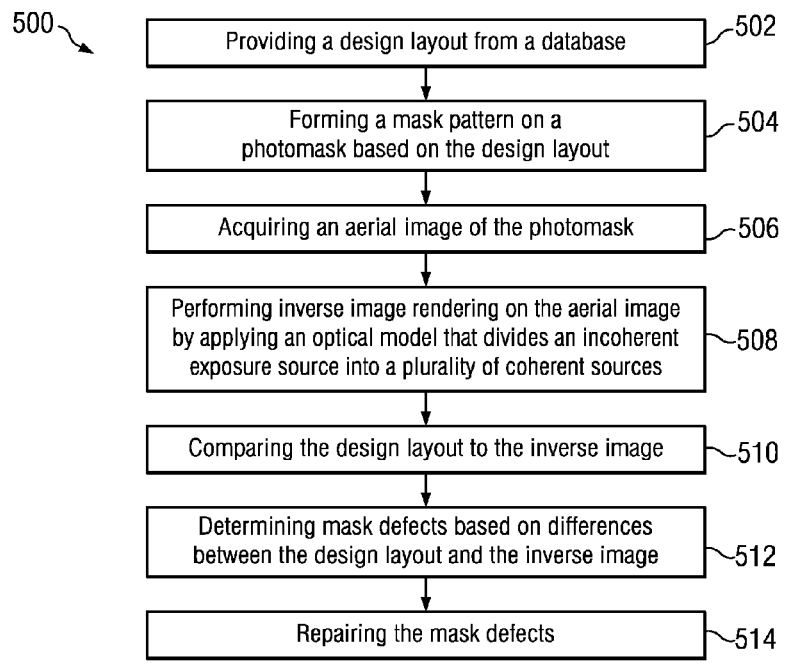
FIG. 5 is a flowchart illustrating an IC method according to aspects of the present disclosure.

Referring now to FIG. 5, shown is a flowchart of an IC method 500, which is directed to repairing mask defects in a photomask. The IC method 500 begins at block 502 by providing a design layout of an IC device from a database. A mask pattern on a photomask that is based on the design layout provided at block 502 is created at block 504 using a conventional mask process previously described. Continuing to block 506, an aerial image of the photomask is obtained using an AIMS.

The IC method proceeds to block 508 where an inverse image rendering is performed on the aerial image by applying an optical model that divides an incoherent exposure source into a plurality of coherent sources. The optical model includes the mathematical models described above and shown in FIGS. 2 and 3. The inverse image is the simulated aerial image, the latent image on the photoresist, or the wafer pattern. The inverse image can be reconstructed by acquiring the light field at pupil plane from the actual photomask as discussed previously. The mathematical models for calculating the simulated aerial image assumes that an incoherent light source can be divided into a plurality of coherent light sources. The resulting images from each coherent light source can be summed together to get the complete simulated aerial image.

At block 510, the simulated aerial image is compared to the original design layout.

At block 512, mask defects are determined based on the difference between the simulated aerial image and the design layout.

Finally, at block 514, the mask defects are repaired, by for example, adding OPC features to the mask. To calculate the quality of the OPC mask, the design layout may be compared to a simulated aerial image generated using the OPC mask to determine if features patterned within the aerial image are within some threshold of the corresponding features in the design layout. The process may be repeated until acceptable results are obtained.

The IC methods 100 and 500 produce a simulated aerial image or a virtual wafer pattern. The simulated aerial image is obtained by performing a virtual lithography process simulation using optical models. The models generate a simulated photomask pattern from an aerial image obtained with an AIMS and generates the simulated wafer pattern using the optical models shown in FIGS. 2 and 3.

In IC methods 100 and 500, before the actual wafer pattern is produced by the wafer process using the mask, the IC methods 100 and 500 implement a virtual process flow through use of optical models. The disclosed IC method 500 provides a time and cost-effective method for mask defect detection and repair.

Other process steps may be implemented before, during and/or after the method 100. The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

The present disclosure describes an integrated circuit (IC) method for OPC modeling that includes receiving a photomask with a pattern based on a design layout for an integrated circuit, acquiring an aerial image and a diffraction image of the photomask using an optical microscope system, forming a photoresist pattern using the photomask, acquiring an image of the photoresist pattern using a scanning electron microscope (SEM), and simulating optical proximity corrections (OPC) according to stage modeling that includes data from the image of the photoresist pattern and data from the aerial image and diffraction image of the photomask.

The present disclosure also describes an IC design method for repairing mask defects. The method includes providing a design layout for an integrated circuit, forming a mask pattern on a photomask, acquiring an aerial image and a diffraction image of the photomask using an optical microscope system, performing inverse image rendering on the aerial image and the diffraction image by applying an optical model that divides an incoherent exposure source into a plurality of coherent sources, determining mask defects based the design layout and the simulated image from the inverse image, and repairing the mask defects.

In another embodiment, the IC design method includes providing a design layout for an integrated circuit, forming a mask pattern on a photomask, acquiring an aerial image of the photomask using an optical microscope system, applying an optical model that divides an incoherent exposure source into a plurality of coherent sources, extracting mask defects from the design layout and the simulated image from the inverse image, and repairing the mask defects. The optical model generates a simulated image of the mask pattern and a simulated aerial image from the aerial image and the diffraction image of the photomask.

What is claimed is:

1. A method for optical proximity correction (OPC) modeling, comprising:
   receiving a photomask with a pattern based on a design layout for an integrated circuit (IC);
   acquiring, by an optical microscope system, an aerial image and a diffraction image of the photomask;
   forming a photoresist pattern using the photomask;
   acquiring, by a scanning electron microscope (SEM), an image of the photoresist pattern;
   generating a simulated aerial image from the aerial image and the diffraction image;
   detecting defects based on differences between the simulated aerial image and the SEM image; and
   simulating optical proximity corrections based on the defects.

2. The method of claim 1, further comprising:
   providing OPC features to another design layout according to the simulated OPC.

3. The method of claim 1, further comprising:
   extracting photoresist reaction data according to a difference between the simulated aerial image of the photomask and the SEM image.

4. The method of claim 1, further comprising building one or more stage models based on data from the aerial image and data from the SEM image.

5. The method of claim 4, wherein the one or more stage models is based on an optical model that divides an incoherent exposure source into a plurality of coherent sources.

6. The method of claim 5, wherein the optical model generates a simulated image of a mask pattern.

7. The method of claim 6, wherein the optical model expresses the simulated image of the mask pattern as a function of light field of illumination of a microscope condenser, polarization decomposition, transfer function of microscope pupil, and light field through mask.

8. The method of claim 7, wherein the simulated aerial image is a function of light field of scanner illumination, transfer function of scanner pupil, and reflection and transmission computation with polarization decomposition.

9. A method for repairing mask defects in a photomask, comprising:
   providing a photomask with a mask pattern for an integrated circuit (IC);
   receiving an aerial image and a diffraction image of the photomask from an optical microscope system;
   performing inverse image rendering on the aerial image by applying an optical model that divides an incoherent exposure source into a plurality of coherent sources, wherein the optical model comprises calculations that generate a simulated aerial image from the aerial image and the diffraction image of the photomask;
   determining mask defects by comparing from a design layout of the IC and the simulated aerial image; and
   repairing the mask defects on the photomask.

10. The method of claim 9, wherein the calculations comprise simulation of an image of the mask pattern from the aerial image and the diffraction image of the photomask.

11. The method of claim 10, wherein the simulated image of the mask pattern is a function of light field of illumination of a microscope condenser, polarization decomposition, transfer function of microscope pupil, and light field through mask.

12. The method of claim 10, wherein data from the simulated image of the mask pattern generates a simulated aerial image.

13. The method of claim 12, wherein the simulated aerial image is a function of light field of scanner illumination, transfer function of scanner pupil, and reflection and transmission computation with polarization decomposition.

14. The method of claim 9, wherein performing inverse image rendering comprises acquiring a light field at pupil plane from the photomask.

15. The method of claim 9, wherein the optical model is separated from lumped effects.

16. A method for repairing mask defects in a photomask, comprising:
   receiving a design layout for an integrated circuit;
   forming a mask pattern on a photomask;
   acquiring, by an optical microscope system, an aerial image of the photomask;
   applying an optical model that divides an incoherent exposure source into a plurality of coherent sources, wherein the optical model generates a simulated image of the mask pattern and a simulated aerial image from the aerial image of the photomask, wherein the simulated image of the mask pattern is a function of light field of illumination of a microscope condenser, polarization decomposition, transfer function of microscope pupil, and light field through mask;
   extracting mask defects by comparing the design layout and the simulated aerial image; and
   repairing the mask defects.

17. The method of claim 16, wherein the simulated aerial image is a function of light field of scanner illumination, transfer function of scanner pupil, and reflection and transmission computation with polarization decomposition.

18. The method of claim 16, wherein the optical model is separated from lumped effects.

* * * * *